US007756176B2

(12) United States Patent  
Kim et al.

(10) Patent No.: US 7,756,176 B2
(45) Date of Patent: Jul. 13, 2010

(54) INTERBAND TUNNELING INTERSUBBAND TRANSITION SEMICONDUCTOR LASER

(75) Inventors: Gyungock Kim, Seoul (KR); In Gyoo Kim, Daejeon (KR); Junghyung Pyo, Seoul (KR); Ki Seok Chang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 119 days.

(21) Appl. No.: 11/952,408

(22) Filed: Dec. 7, 2007

(65) Prior Publication Data

US 2008/0151956 A1   Jun. 26, 2008

(30) Foreign Application Priority Data

Dec. 8, 2006   (KR) ............... 10-2006-0125065

(51) Int. Cl.
    *H01S 5/00* (2006.01)
(52) U.S. Cl. ............ 372/43.01; 372/45.01; 372/45.012; 372/68
(58) Field of Classification Search ............ 372/45.012, 372/43.01, 45.01, 68
    See application file for complete search history.

(56) References Cited

U.S. PATENT DOCUMENTS

| 5,457,709 | A |   | 10/1995 | Capasso et al. |
| 5,509,025 | A |   | 4/1996  | Capasso et al. |
| 5,570,386 | A |   | 10/1996 | Capasso et al. |
| 5,588,015 | A | * | 12/1996 | Yang ............... 372/45.012 |
| 5,727,010 | A |   | 3/1998  | Capasso et al. |
| 5,745,516 | A |   | 4/1998  | Capasso et al. |
| 5,799,026 | A | * | 8/1998  | Meyer et al. ........ 372/45.01 |
| 5,936,989 | A |   | 8/1999  | Capasso et al. |
| 6,556,604 | B1 |   | 4/2003  | Capasso et al. |

FOREIGN PATENT DOCUMENTS

| JP | 2001-077466 | 3/2001 |
| JP | 2003-046125 | 2/2003 |
| KR | 1020060052578 | 5/2006 |

OTHER PUBLICATIONS

Qing Hu et al; "Feasibility of far-infrared lasers using multiple semiconductor quantum wells", Appl. Phys. Lett. 59 (23) Dec. 2, 1991, pp. 2923-2925.

Shmuel I. Borenstain et al; "Evaluation of the feasibility of a far-infrared laser based on intersubband transitions in GaAs quantum wells", Appl. Phys. Lett. 55 (7), Aug. 14, 1989, pp. 654-656.

(Continued)

*Primary Examiner*—Minsun Harvey
*Assistant Examiner*—Yuanda Zhang
(74) *Attorney, Agent, or Firm*—Ladas & Parry LLP (57) ABSTRACT

An interband resonant tunneling intersubband transition laser is disclosed, and includes a semiconductor substrate, and a first cladding layer, an active region structure layer and a second cladding layer formed on the semiconductor substrate. The active region structure layer includes quantum well layers and quantum barrier layers that are alternately stacked and have a broken energy bandgap. Thus, the interband resonant tunneling intersubband transition laser operates in a cascade mode in which an intersubband radiative transition and interband tunneling of carriers consecutively and repetitively occur in the active region structure layer, and thus can achieve a high output from a simple, compact structure.

19 Claims, 8 Drawing Sheets

OTHER PUBLICATIONS

R.F. Kazarinov et al; "Possibility of the Amplification of Electromagnetic Waves In A Semiconductor With A Superlattice", Soviet Physics-Semiconductors vol. 5, No. 4, Oct. 1971, pp. 707-709.

W.M.Yee, et al; "Carrier transport and intersubband population inversion in coupled quantum wells", Appl. Phys. Lett. 63(8), Aug. 23, 1993 pp. 1089-1091.

A. Kastalsky et al; "Possibility of infrared laser in a resonant tunneling structure", Appl. Phys. Lett. 59(21), Nov. 18, 1991, pp. 2636-2638.

K.K. Choi, et al; "Periodic negative conductance by sequential resonant tunneling through an expanding high-field superlattice domain", Physical Review B, vol. 35, No. 8, Mar. 15, 1987, pp. 4172-4175.

D.F. Nelson, et al; "Band nonparabolicity effects in semiconductor quantum wells", Physical Review B, vol. 35, No. 14, May 15, 1987, pp. 7770-7773.

J. Faist, et al; "Quantum-well intersub-band electroluminescent diode at $\lambda=5\mu m$", Electronics Letters Dec. 9, 1993, vol. 29, No. 25, pp. 2230-2231.

Jerome Faist, et al; "Phonon limited intersubband lifetimes and linewidths in a two-dimensional electron gas", Appl. Phys. Lett. 64(7) Feb. 14, 1994, pp. 872-874.

F. Capasso, et al; "Pseudo-quaternary GaInAsP Semiconductors: A new $Ga_{0.47}In_{0.53}As$/InP graded gap superlattice and its applications to avalanche photodiodes", Appl. Phys. Lett. 45(11), Dec. 1, 1984, pp. 1193-1195.

Federico Capasso, et al; "Staircase Solid-State Photomultipliers and Avalanche Photodiodes with Enhanced Ionization Rates Ratio", IEEE Transactions on Electron Devices, vol. ED-30, No. 4, Apr. 1983, pp. 381-390.

Jerome Faist, et al; "Mid-infrared field-tunable intersubband electroluminescence at room temperature by photon-assisted tunneling in coupled-quantum wells", Appl. Phys. Lett. 64(9), Feb. 28, 1994, pp. 1144-1146.

* cited by examiner

INTERBAND TUNNELING INTERSUBBAND TRANSITION SEMICONDUCTOR LASER

CROSS-REFERENCE TO RELATED PATENT APPLICATION

This application claims the benefit of Korean Patent Application No. 10-2006-0125065, filed on Dec. 8, 2006, in the Korean Intellectual Property Office, the disclosure of which is incorporated herein in its entirety by reference.

BACKGROUND OF THE INVENTION

1. Field of the Invention

The present invention relates to an intersubband transition semiconductor laser, and more particularly, to an intersubband transition semiconductor layer capable of achieving a high output with an economical price, an easy manufacturing process, and a simple structure including a small number of stacked layers.

2. Description of the Related Art

Those skilled in the art have long predicted that a semiconductor superlattice structure may contribute to amplifying an electromagnetic wave to realize a unipolar intersubband transition quantum well semiconductor laser, and have made many efforts to develop the unipolar intersubband transition quantum well semiconductor laser. This type of intersubband transition lasers have the advantages of a tailoring the frequency in the wide-range spectrum, a narrow line width based on the theoretical absence of line-width increasing factors, and low temperature-dependency of an oscillation threshold in comparison to a conventional bipolar semiconductor laser.

A properly designed unipolar intersubband transition quantum well semiconductor laser may emit light having a submillimeter wavelength at a mid/far infrared ray. For example, light with a wavelength ranging from about 3 to 100 µm may be emitted by a carrier transition between quantum confinement states. The wavelength of light emitted may be designed with same heterostructure system over a wide spectrum range. The wavelength band cannot be obtained through a conventional semiconductor laser diode. Also, the unipolar intersubband transition quantum well semiconductor laser can be manufactured on the basis of a sufficiently technically developed III-V compound semiconductor materials (e.g. a heterostructure based on GaAs or InP) which have relatively wide energy bandgaps. For this reason, there is no need to use a material with a small energy bandgap, which is sensitive to temperature and requires complex processes.

Conventional technologies for implementing the unipolar intersubband transition quantum well semiconductor laser include a resonant tunneling structure based on a typical multiple quantum-well structure. For example, W. M. Yee et al. analyzed two kinds of coupled quantum well structures in "Carrier transport and intersubband population inversion in couple quantum well", Appl. Phys. Lett. 63(8), pp. 1089-1091 (1993). Each of the coupled quantum well structures includes a quantum well for emission that is interposed between energy filter wells, coupled with a quantum well structure interposed between n-type doped injector/collector regions.

In the year of 1994, Faist, Capasso, et al. named a unipolar intersubband transition quantum well semiconductor laser a quantum cascade LASER (QCL), and succeeded in the first emission of light with a wavelength of about 4.2 µm from a GaInAs/AlInAs material-based system. The laser that can be implemented with another material-based system can easily be designed to oscillate at a predetermined wavelength over a wide spectrum range.

The quantum cascade LASER includes an undoped multi-layered semiconductor quantum well structure as an active region. The quantum well active region is separated from a neighboring quantum well active region by an energy relaxation region. For example, a radiative transition between confinement energy states in the quantum well active region may be designed to be a vertical transition occurring in the same quantum well or a diagonal transition occurring between confinement energy states of neighboring quantum wells.

The unipolar laser diode with such a wavelength band may be applied in a variety of fields such as contamination detection, process control, and automotive. Thus, the quantum cascade LASER that can emit mid/far infrared rays has received much commercial and scientific attention.

However, in the conventional quantum cascade LASER, one electron emits N photons, while passing through N unit-cells stacked structures, where each unit cell includes tens of layers and have a quantum well active region and an energy relaxation region. To obtain a sufficient optical output, N must be about 25 to 70. For this reason, the structure is complicated and the manufacturing process is extremely difficult, since a multi-layered structure must be grown epitaxially using equipment such as a molecular beam epitaxy system. Thus, the conventional quantum cascade LASER has been studied and developed to an extremely limited extent.

SUMMARY OF THE INVENTION

The present invention provides an interband resonant tunneling quantum semiconductor laser which can achieve a high optical power output with a simple, compact structure having a small number stack structure, can be easily manufactured, and uses an intersubband radiative transition and interband resonant tunneling in an active region of a semiconductor heterostructure.

According to an aspect of the present invention, there is provided an intersubband transition semiconductor laser including a first cladding layer, an active region structure layer, and a second cladding layer that are formed on a semiconductor substrate, and upper and lower electrodes. The active region structure layer includes a plurality of quantum well layer/quantum barrier layer structures that are repetitively stacked on top of each other to allow an intersubband laser transition and interband resonant tunneling of injected carriers.

This structure creates a broken-bandgap based semiconductor heterostructure in the active region structure layer, where an intersubband radiative transition occurs. When an operation voltage is applied, carriers transited between laser energy states of a quantum well layer and undergo interband resonant tunneling through aligned electron-hole states of a consecutive quantum barrier layer. This improves the escape rate of the carriers from a laser transition lower state of the quantum well layer, and the injection efficiency of the carriers to the next quantum well layer, allowing efficient population inversion between laser transition states of the quantum well layer. Accordingly, there is provided an intersubband transition semiconductor laser that can achieve a high output with a simple compact structure including a small number of stacked layers, and can be easily manufactured.

An interband tunneling intersubband transition semiconductor laser according to the present invention is simple, compact, and cheap to manufacture, compared to a conventional quantum cascade laser having a complicated multilayered structure which makes manufacturing difficult.

In the broken bandgap heterostructure, a quantum barrier layer includes a single material layer of a material having a relatively wide energy bandgap, such as GaSb or GaInSb, and may have a complex structure such as a superlattice structure, and a multiple quantum well structure based on a material system such as GaSb, GaInSb, or GaAlSb.

In the broken bandgap heterostructure, a quantum well layer includes a single material layer of a material having a small energy bandgap such as InAs or InGaAsSb, and may have a complex structure such as a superlattice structure, and a multiple quantum well structure based on a material system such as InAs, AlSb, or InAlSb.

When a voltage is applied to the electrodes, an intersubband transition and interband resonant tunneling of carriers occur consecutively in the active region structure layer. The intersubband transition and interband resonant tunneling may occur in a cascade mode.

For example, in the case where InAs and GaSb constitute a heterostructure, a unique energy band alignment between the two materials allows the formation of a broken bandgap heterostructure, since the maximum energy level of a valence band of a GaSb quantum barrier layer is higher than the minimum energy of a conduction band of an InAs quantum well layer by about 0.15 eV. Also, the quantum resonant tunneling is an ultrafast-electron transfer phenomenon, and transfer efficiency of electrons is considerably increased by using this phenomenon.

In the heterostructure based on the InAs—GaSb material system, when an operation voltage is applied, interband resonant tunneling of carriers occurs from an electron state of the InAs quantum well layer to a hole state of the GaSb quantum barrier layer, and may help improve the efficiency of population inversion for an intersubband transition laser action of carriers in the quantum well layer.

In the broken bandgap heterostructure, the quantum well layer and the quantum barrier layer each may include a single material layer, but may be a superlattice structure or a quantum well structure including a plurality of material layers.

Optionally, the quantum well layer may include two material layers having different minimum energy levels of a conduction band, and the maximum energy level of a valence band of the quantum barrier layer may be higher than the higher of the minimum energy levels of the conduction bands of the two material layers.

Optionally, the quantum barrier layer may include two material layers having different maximum energy levels of a valence band, and the minimum energy level of a conduction band of the quantum well layer may be lower than the lower of the maximum energy levels of the valence bands of the two material layers.

Optionally, the quantum well layer may include two material layers having different minimum energy levels of a conduction band, the quantum barrier layer may include two material layers having different maximum energy levels of a valence band, and the higher of the minimum energy levels of the conduction bands of the two material layers of the quantum well layer may be lower than the lower of the maximum energy levels of the valence bands of the two material layers of the quantum barrier layer.

Optionally, the quantum well layer may include two material layers having different minimum energy levels of a conduction band, the quantum barrier layer may include three material layers, a middle material layer of the three material layers may have a maximum energy level of a valence band that is lower than the maximum energy levels of the valence bands of the other two materials, and the higher of the minimum energy levels of the conduction bands of the two material layers of the quantum well layer is lower than the lowest of the maximum energy levels of the valence bands of the three material layers of the quantum barrier layer.

Optionally, the quantum barrier layer may include two material layers having different maximum energy levels of a valence band, the quantum well layer may include three material layers, a middle material layer of the three material layers may have a minimum energy level of a conduction band that is lower than the minimum energy levels of the conduction bands of the other two material layers, and the lower of the maximum energy levels of the valence bands of the two material layers of the quantum barrier layer is higher than the highest of the minimum energy levels of the conduction bands of the three material layers of the quantum well layer.

The semiconductor laser of claim may further include a first waveguide layer between the first cladding layer and the active region structure layer, a second waveguide layer between the second cladding layer and the active region structure, and a buffer layer between the semiconductor substrate and the first cladding layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art. Like reference numerals denote like elements in the drawings, and thus their description will be omitted. Various elements and regions are illustrated schematically in the drawings. Thus, the present invention is not limited by relative sizes or intervals shown in the accompanying drawings. It will also be understood that when a layer is referred to as being "on" another layer or substrate, it can be directly on the other layer or substrate, or intervening layers may also be present.

The present invention provides an interband tunneling intersubband transition semiconductor laser including a semiconductor substrate; a first cladding layer; an active region structure layer formed on the first cladding layer, and including quantum well layers and quantum barrier layers that are alternately stacked a plurality of times and have a broken bandgap energy; a second cladding layer; and electrodes under the semiconductor substrate and on the cladding layer.

Figure 1:
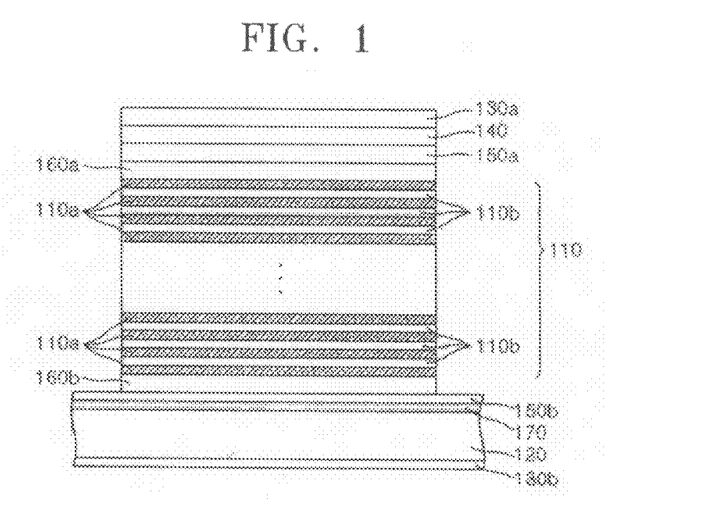
FIG. 1 is a side sectional view of an intersubband transition semiconductor laser according to an embodiment of the present invention.

FIG. 1 is a conceptual side-sectional view of an interband tunneling intersubband transition semiconductor laser according to an embodiment of the present invention.

A buffer layer 170, a first cladding layer 150b, a first waveguide layer 160b, a second waveguide layer 160a, and a second cladding layer 150a are provided on a semiconductor substrate 120.

The first cladding layer 150b may be placed between an active region structure layer 110 and an electrode 130b. Also, the second cladding layer 150a may be placed between the active region structure layer 110 and an electrode 130a. The buffer layer 170 may be placed between the first cladding layer 150b and the electrode 130b.

Optionally, a contact layer (not shown) may be further provided between the semiconductor substrate 120 and the electrode 130b by impurity doping, in order to improve adhesion and ohmic contact between the semiconductor substrate 120 and the electrode 130b. A contact layer 140 may be further provided between the electrode 130a and the second cladding layer 150a by impurity doping.

The second waveguide layer 160a may be provided between the active region structure layer 110 and the second cladding layer 150a, and the first waveguide layer 160b may be provided between the active region structure layer 110 and the first cladding layer 150b.

The active region structure layer 110 includes quantum well layers 110a and quantum barrier layers 110b alternately stacked, thereby forming a broken bandgap heterostructure.

The quantum well layer 110a may be formed of a single material with a small energy bandgap, such as InAs or InGaAsSb, or may have a complex structure such as a superlattice structure or a multiple quantum well structure based on a material system such as InAs, AlSb, or InAlSb.

The quantum barrier layer 110b may be formed of a single material with a relatively wide energy bandgap, such as GaSb or GaInSb, or may be a complex structure such as a superlattice structure or a multiple quantum well structure based on a material system such as GaSb, GaInSb, or GaAlSb.

The electrodes 130a and 130b may be respectively provided under the semiconductor substrate 120 and on the active region structure layer 110.

When bias is applied to the electrodes 130a and 130b, an intersubband transition and interband resonant tunneling of carriers may consecutively occur within the active region structure layer 110. Particularly, the intersubband transition and the interband resonant tunneling may occur in a cascade mode.

The method of forming the quantum well layer 110a and the quantum barrier layer 110b is not specifically limited. Examples include molecular beam epitaxy (MBE) and atomic layer deposition (ALD). These methods are well known to those skilled in the art, and thus the detailed description thereof will be omitted.

Figure 2A:
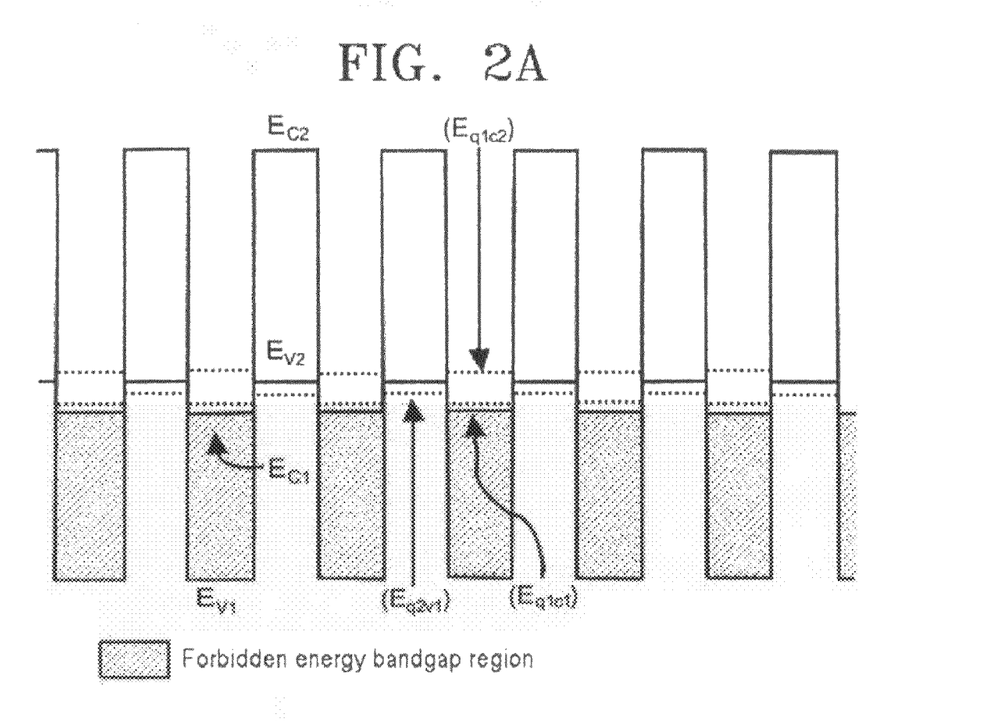
FIGS. 2A-2B, 3A-3B, and 4-7 are energy diagrams illustrating parts of active region structure layers in the cases where a voltage is applied or not applied to intersubband transition semiconductor lasers according to embodiments of the present invention.
Figure 2B:
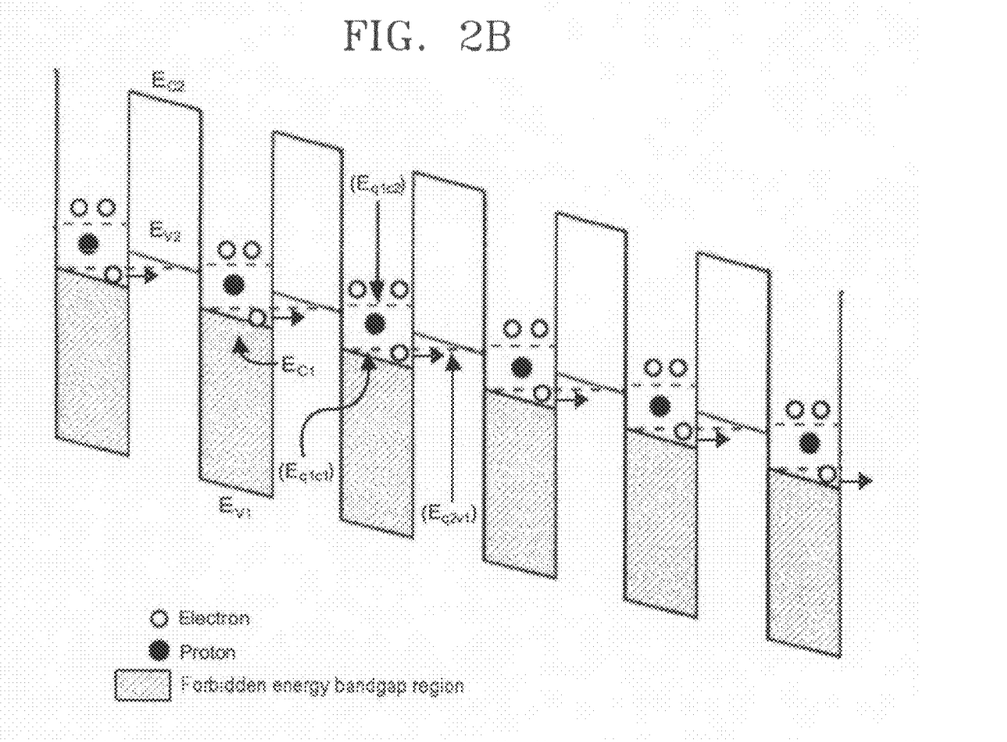

FIGS. 2A and 2B are energy diagrams of the active region structure layer respectively showing the cases where a voltage is applied and is not applied to the interband tunneling intersubband transition semiconductor laser according to an embodiment of the present invention. In FIGS. 2A and 2B, the vertical axis represents the energy level and the horizontal axis represents the stack direction of the active region structure layer.

Here, each quantum well layer may be formed of a material having a small energy bandgap, such as InAs, InGaAsSb, or InAsSb. Each quantum barrier layer may be formed of a material having a relatively wide energy bandgap, such as GaSb or InGaSb. The quantum well and the quantum barrier layers are alternately stacked, thereby forming a heterostructure of InAsGaAlSb material system having a broken bandgap.

As illustrated in FIG. 2A, the maximum energy level $E_{V2}$ of a valence band of the quantum barrier layer is higher than the minimum energy level $E_{C1}$ of a conduction band of the quantum well layer by band alignment of the quantum well and quantum barrier layers. In the case of the broken bandgap heterostructure of the InAsGaAlSb material system, the energy level difference between the energy levels may be 0.1 eV to 0.2 eV.

In FIG. 2A, $E_{q1c2}$ and $E_{q1c1}$ respectively denote a quantum confined upper electron state and a quantum confined lower electron state where a radiative transition of electrons occur in the quantum well layer. $E_{q2v1}$ denotes a hole confined subband (or hole confined state) of the quantum barrier layer.

When a voltage is applied to an electrode, the energy diagram of FIG. 2A is changed as described in FIG. 2B. When a voltage is applied, carriers are injected to the quantum confined upper electron state $E_{q1c2}$ of the quantum well layer of the active region structure layer. After their lifetime $\tau_{q1c1}$ elapses, those carriers undergo a radiative transition to the quantum confined lower electron state ($E_{q1c1}$). In this process, photons are generated and radiated.

The carriers having undergone the radiative transition to the quantum confined lower electron state $E_{q1c1}$ are aligned with the hole confined state $E_{q2v1}$ of a consecutive quantum barrier layer. Those carriers are reinjected to the quantum confined upper electron state $E_{q1c2}$ of a consecutive quantum well layer by interband resonant tunneling.

As illustrated in FIG. 2B, carriers injected to the quantum confined upper electron state $E_{q1c2}$ are well confined because it is difficult for the carriers to pass through a consecutive quantum barrier, but the carriers which transition to the quantum confined lower electron state $E_{q1c1}$ are easily moved and reinjected to the quantum confined upper electron state of the next quantum well through the aligned hole confined state $E_{q2v1}$. This phenomenon consecutively occurs in each adjacent quantum well and quantum barrier layer.

This phenomenon consequently reduces the lifetime of carriers at the quantum confined lower electron state $E_{q1c1}$, compared to the lifetime of carriers at the quantum confined upper electron state $E_{q1c2}$, causing population inversion of carriers between both states. This improves an escape rate and injection efficiency to the next quantum well layer of the carriers.

The population inversion between the quantum confined upper electron state $E_{q1c2}$ and the quantum confined lower electron state $E_{q1c1}$ causes a laser transition, thereby emitting a plurality of photons. That is, as one electron undergoes a series of the above processes while passing through the stack of N pairs of quantum well layers and quantum barrier layers, N photons are effectively generated.

This structure is an injectorless structure, since it lacks an injector region of the conventional art, such as a multilayered Bragg reflector or an energy relaxation region between active regions. The injectorless structure allows a very thin and small intersubband transition semiconductor laser.

The output wavelength of the semiconductor laser is determined by energy confinement states of a quantum well corresponding to laser transition levels of a quantum well layer.

Also, a quantum well layer may have a complex structure that has different minimum energy levels of a conduction band, or a quantum barrier layer may have a complex structure that has different maximum energy levels of a valence band, so that a design and output efficiency of an output wavelength of energy confinement states can be controlled.

FIGS. 3, 4, 5, 6 and 7 illustrate examples of a broken bandgap heterostructure in which quantum well layers and quantum barrier layers have a multilayered complex structure in the active region structure layer of FIG. 2.

Figure 3A:
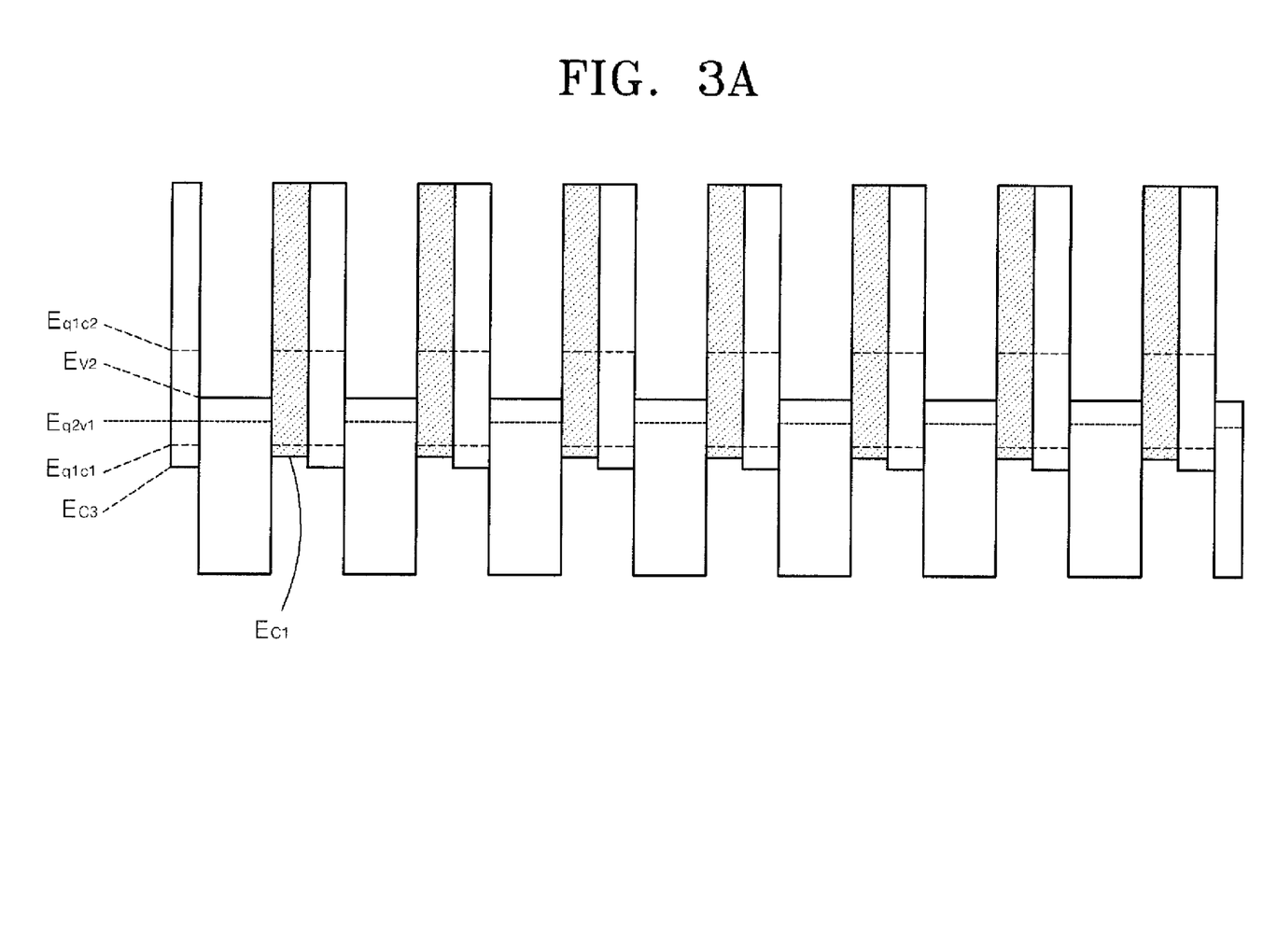
Figure 3B:
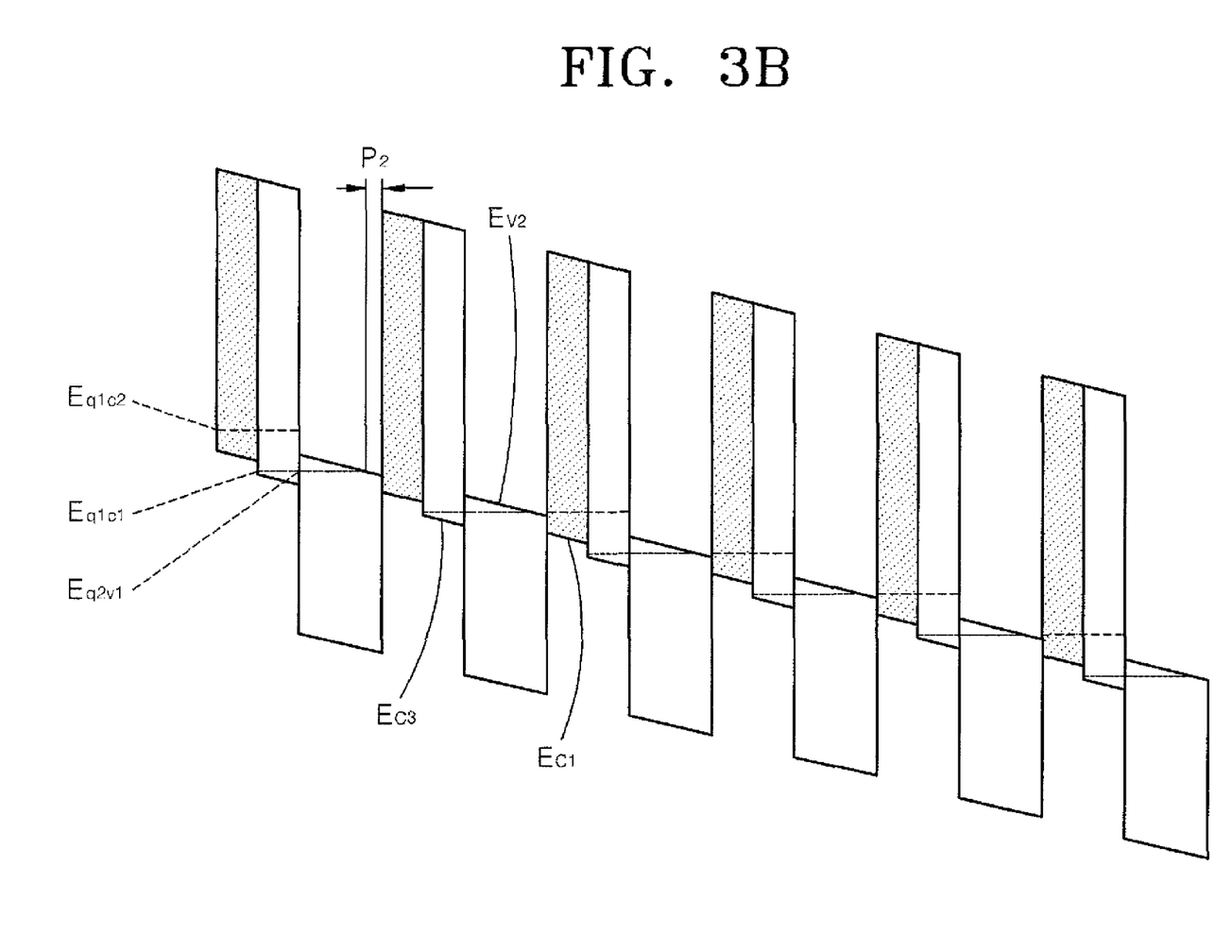

FIGS. 3A and 3B are energy diagrams of a part of an active region structure layer respectively showing the cases where a voltage is and is not applied to an intersubband transition semiconductor laser according to another embodiment of the present invention.

FIGS. 3A and 3B are energy diagrams of an example in which the quantum well layer of FIG. 2 includes a plurality of material layers, instead of a single material layer. As illustrated in FIG. 3A, a quantum well layer includes two material layers that have different respective minimum energy levels $E_{C1}$ and $E_{C3}$ of a conduction band.

Also, as illustrated in FIG. 3A, the maximum energy level $E_{V2}$ of a valence band of a quantum barrier layer is greater than the higher level $E_{C1}$ of the two minimum energy levels $E_{C1}$ and $E_{C3}$ of the conduction band of the quantum well layer.

Figure 4:
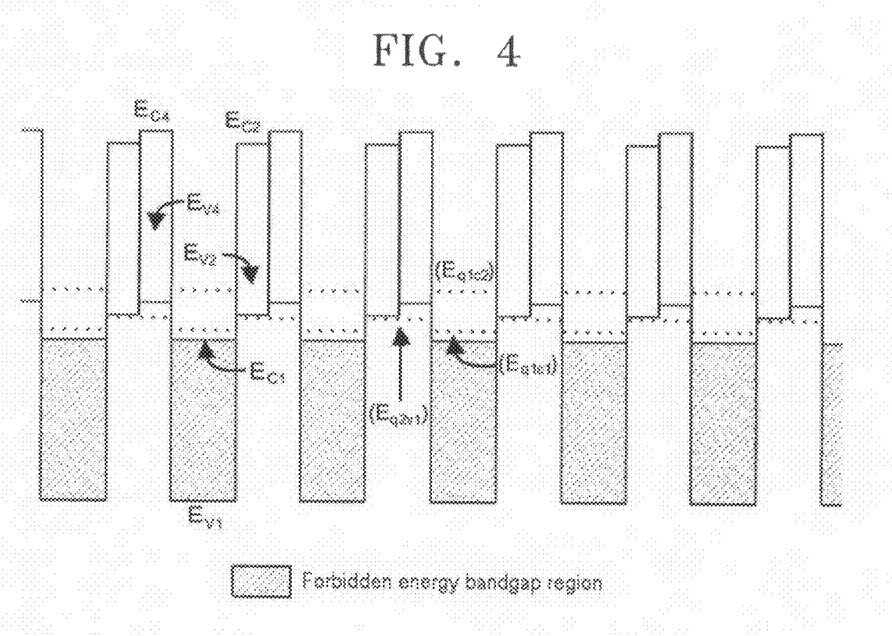

FIG. 4 is an energy diagram of an active region structure layer of an example in which the quantum barrier layer of FIG. 2 includes a plurality of material layers, instead of including a single material layer. As illustrated in FIG. 4, a quantum barrier layer includes two layers that have different respective maximum energy levels $E_{V2}$ and $E_{V4}$ of a valence band. In FIG. 4, the energy bandgap of a first quantum barrier material is smaller than that of a second quantum barrier material.

In FIG. 4, $E_{V2}$ and $E_{V4}$ respectively denote the maximum energy levels of the valence band of the two material layers of the quantum barrier layer, and $E_{C2}$ and $E_{C4}$ respectively denote the minimum energy levels of a conduction band thereof. As the maximum energy levels of the valence band of the quantum barrier layer are higher than the minimum energy level $E_{C1}$ of a conduction band of a quantum well layer, a broken bandgap heterostructure is formed.

Here, $E_{q1c2}$ and $E_{q1c1}$ respectively denote a quantum confined upper electron state subband and a quantum confined lower electron state subband where a radiative transition of an electron occurs in the quantum well layer. $E_{q2v1}$ denotes a hole confined subband of the quantum barrier layer. The quantum well layer and the quantum barrier layer are constructed such that interband resonant tunneling occurs due to alignment between the electron state $E_{q1c1}$ of a quantum well layer and the hole state $E_{q2v1}$ of a consecutive quantum barrier layer when an operation voltage is applied.

Figure 5:
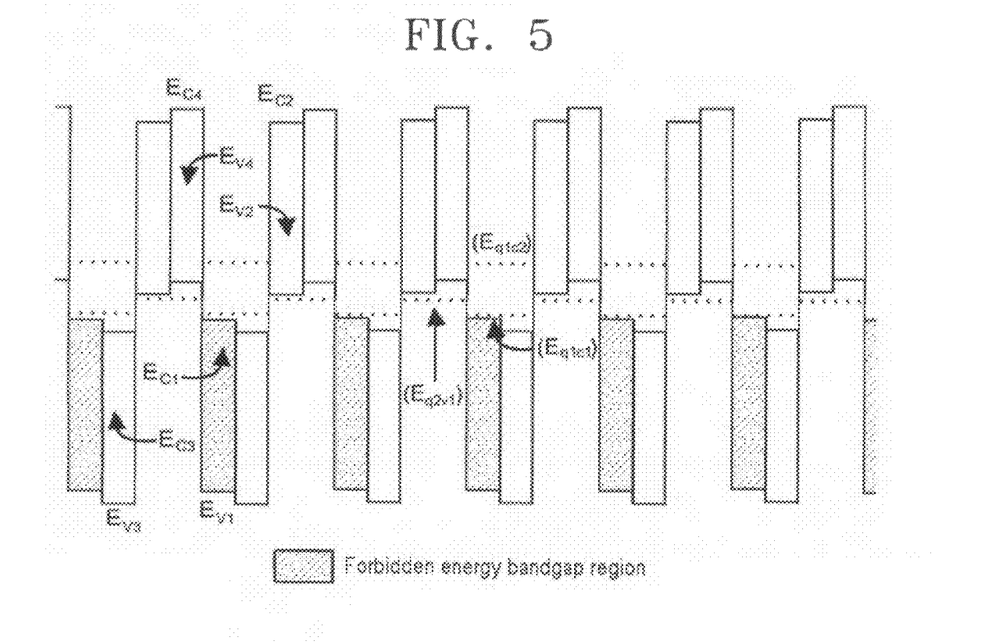

FIG. 5 is an energy diagram of an example of a broken bandgap heterostructure employing a quantum well layer of FIG. 2 that has a complex structure including a plurality of material layers instead of a single material layer, and a quantum barrier layer of FIG. 2 that includes a plurality of material layers instead of a single material layer.

In FIG. 5, a quantum well layer includes two material layers, and the energy bandgap of a first quantum well material layer is smaller than the energy bandgap of a second quantum well material layer. $E_{V1}$ and $E_{V3}$ respectively denote the maximum energy levels of the valence bands of two materials of the quantum well layer, and $E_{C1}$ and $E_{C3}$ respectively denote the minimum energy levels of the conduction bands of the two material layers.

The quantum barrier layer also includes two material layers, and the energy bandgap of a first quantum barrier material layer is smaller than that of a second quantum barrier material layer. In FIG. 5, $E_{V2}$ and $E_{V4}$ respectively denote the valence-band maximum energy levels of the two material layers of the quantum barrier layer, and $E_{C2}$ and $E_{C4}$ respectively denote the conduction-band minimum energy levels of the two material layers of the quantum barrier layer. The valence-band maximum energy level of the quantum barrier layer is higher than the conduction-band minimum energy levels of the quantum well layer, thereby forming a broken bandgap heterostructure.

$E_{q1c2}$ and $E_{q1c1}$ respectively denote a quantum confined upper electron state and a quantum confined lower electron state where a radiative transition of an electron occurs in the quantum well layer, and $E_{q2v1}$ denotes a hole confined subband of the quantum barrier layer.

The quantum well layer and the quantum barrier layer are constructed such that interband resonant tunneling occurs due to alignment between the electron state $E_{q1c1}$ of the quantum well layer and the hole state $E_{q2v1}$ of the consecutive quantum barrier layer structure when an operation voltage is applied.

Figure 6:
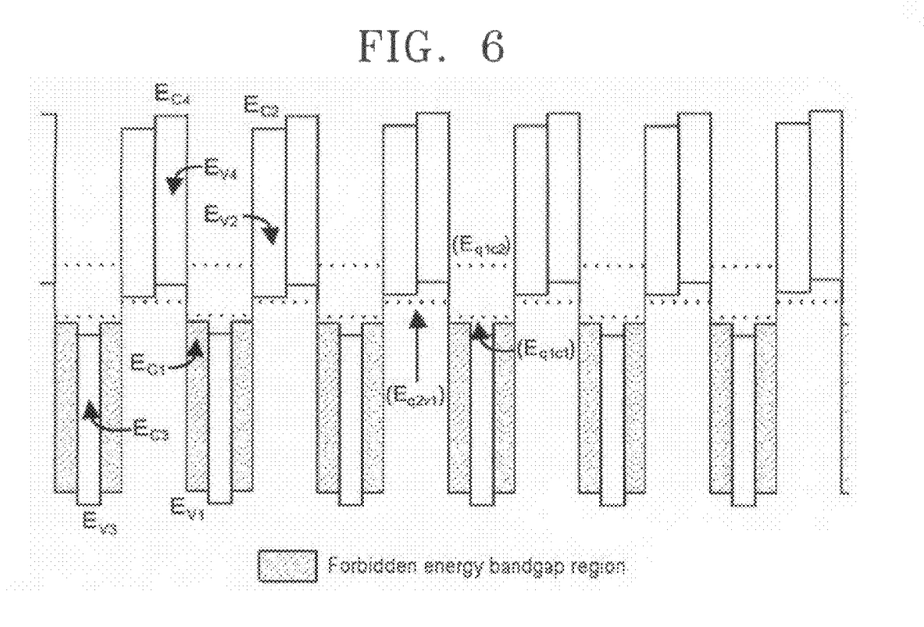

FIG. 6 is an energy diagram in the case where the quantum well layer of FIG. 2 includes three material layers instead of a single material layer, and the quantum barrier layer of FIG. 2 includes two material layers instead of a single material layer.

Figure 7:
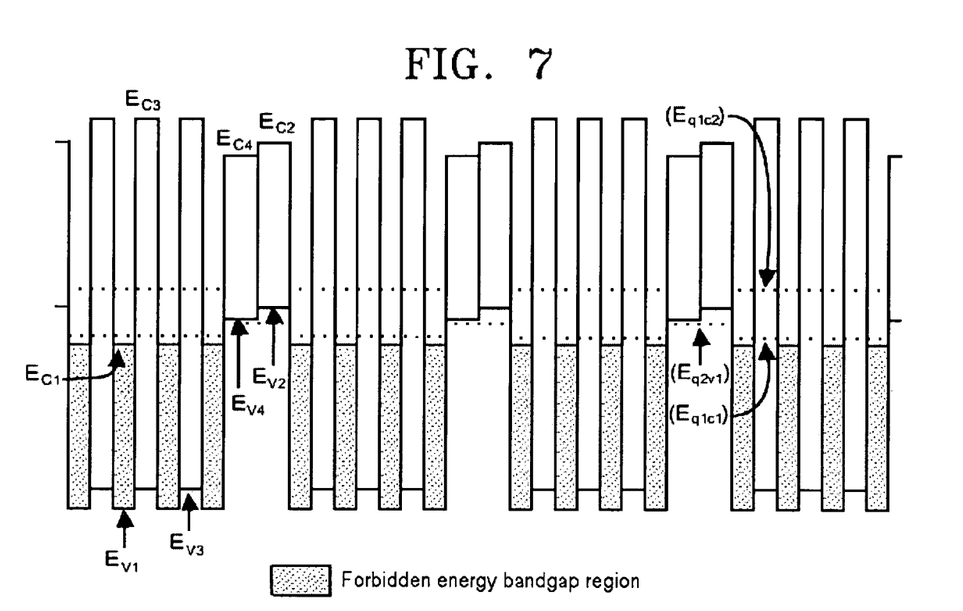

FIG. 7 is an energy diagram in the case where the quantum well layer of FIG. 2 has a multi-quantum well structure instead of a single material layer, and the quantum barrier layer of FIG. 2 includes two material layers instead of a single material layer.

$E_{q1c2}$ and $E_{q1c1}$ respectively denote a quantum confined upper electron state and a quantum confined lower electron state where a radiative transition of an electron occurs in the quantum well layer, and $E_{q2v1}$ denotes a hole subband of the quantum barrier layer.

The quantum well layer and the quantum barrier layer are constructed such that interband resonant tunneling occurs due to alignment between the electron state $E_{q1c1}$ of the quantum well layer and the hole state $E_{q2v1}$ of the consecutive quantum barrier layer when an operation voltage is applied.

As mentioned above, the quantum well layer has a complex structure having different minimum energy levels of a conduction band, or the quantum barrier layer has a complex structure having different maximum energy levels of a valence band, thereby forming a broken bandgap heterostructure. This allows energy confinement states to be controlled, so that the output wavelength, efficiency of power output, and device performance can be controlled.

As described so far, according to the present invention, population inversion between laser transition states is efficiently achieved from a simple compact structure with a small number of stacked layers, so that an intersubband transition interband tunneling semiconductor laser with a simple structure can be easily manufactured, but still obtain high optical power output, especially compared to a conventional quantum cascade laser with a complicated multilayered structure and difficult manufacturing process. Accordingly, a subband transition semiconductor laser of a mid/far infrared ray band having a high optical power output with a low cost can be implemented.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An interband tunneling intersubband transition semiconductor laser comprising a first cladding layer, an active region structure layer, and a second cladding layer that are formed on a semiconductor substrate, and electrodes that are provided under the semiconductor substrate and above the second cladding layer respectively, wherein the active region structure layer includes a plurality of quantum well layers and a plurality of quantum barrier layers that are alternately stacked together to form a heterostructure that has a broken bandgap energy profile which allows interband tunneling to occur, wherein at least one quantum barrier layer includes two material layers having valence bands with different maximum valence energy levels, at least one quantum well layer includes three material layers having a middle material layer sandwiched between two outer material layers such that the middle layer has a conduction band with a minimum conduction energy level that is lower than minimum conduction energy levels of conduction bands of the other two material layers, and a lowest maximum valence energy level of the two material layers of the quantum barrier layer is higher than a highest minimum conduction energy level of the three materials layers of the quantum well layer.

2. The semiconductor laser of claim 1, wherein in the active region structure layer, an intersubband transition and interband resonant tunneling of carriers consecutively occur when voltage is applied to the electrodes.

3. The semiconductor laser of claim 1, wherein the quantum well layer includes at least one selected from the group consisting of InGaAsSb, InAs, AlSb, and InAlSb.

4. The semiconductor laser of claim 1, wherein the quantum barrier layer includes at least one selected from the group consisting of GaSb, GaInSb, and GaAlSb.

5. The semiconductor laser of claim 2, wherein the intersubband transition and the interband resonant tunneling occur in a cascade mode.

6. The semiconductor laser of claim 1, wherein the lowest maximum valence energy level of the two material layers of the quantum barrier layer is about 0.1 eV to about 0.2 eV higher than the highest minimum conduction energy level of the three material layers of the quantum well layer.

7. The semiconductor laser of claim 1, wherein each quantum barrier layer includes two material layers having valence bands with different maximum energy levels, and a minimum energy level of a conduction band of the quantum well layer is lower than the lower of the maximum energy levels of the two material layers of the quantum barrier layer.

8. The semiconductor laser of claim 1, wherein the quantum well layer includes two material layers having conduction bands with different minimum energy levels, the quantum barrier layer includes two material layers having valence bands with different maximum energy levels, and the higher of the minimum energy levels of the conduction bands of the two material layers of the quantum well layer is lower than the lower of the maximum energy levels of the valence bands of the two material layers of the quantum barrier layer.

9. The semiconductor laser of claim 1, wherein the quantum well layer includes two material layers having different minimum energy levels of a conduction band, the quantum barrier layer includes three material layers, wherein a middle material layer of the three material layers has a maximum energy level of a valence band that is lower than maximum energy levels of the valence bands of the other two materials, and the higher of the minimum energy levels of the conduction bands of the two material layers of the quantum well layer is lower than the lowest of the maximum energy levels of the valence bands of the three material layers of the quantum barrier layer.

10. The semiconductor laser of claim 1, wherein the quantum barrier layer has a wider energy bandgap than the quantum well layer.

11. The semiconductor laser of claim 1, wherein the quantum well layer includes a complex structure such as a multi quantum well structure or a superlattice structure.

12. The semiconductor laser of claim 1, further comprising:

a first waveguide layer between the first cladding layer and the active region structure layer;

a second waveguide layer between the second cladding layer and the active region structure; and a buffer layer between the semiconductor substrate and the first cladding layer.

13. The semiconductor laser of claim 1, wherein all of the quantum barrier layers of the plurality of quantum barrier layers include two material layers having valence bands with different maximum valence energy levels.

14. The semiconductor laser of claim 1, wherein all of the quantum well layers of the plurality of quantum well layers include three material layers composed of a middle material layer sandwiched between two outer material layers such that the middle layer has a conduction band with a minimum conduction energy level that is lower than minimum conduction energy levels of conduction bands of the other two material layers.

15. The semiconductor laser of claim 1, wherein all of the quantum barrier layers of the plurality of quantum barrier layers include two material layers having valence bands with different maximum valence energy levels, and wherein all of the quantum well layers of the plurality of quantum well layers include three material layers composed of a middle material layer sandwiched between two outer material layers such that the middle layer has a conduction band with a minimum conduction energy level that is lower than minimum conduction energy levels of conduction bands of the other two material layers.

16. The semiconductor laser of claim 1, wherein when a voltage is applied across the electrodes then carriers can be injected and undergo radiative transitions into the active layer which produce photons.

17. The semiconductor laser of claim 1, wherein when a voltage is applied across the electrodes then carriers can be injected and undergo radiative transitions in the active layer such that each carrier produces a plurality of photons.

18. The semiconductor laser of claim 16, wherein the radiative transitions of the carriers exhibit quantum efficiencies greater than one.

19. The semiconductor laser of claim 1, wherein the active layer includes N number of pairs of quantum well layers and quantum barrier layers such that when the active layer is biased then N number of photons are effectively generated from one excited electron that passes through the N number of pairs of quantum wells and quantum barrier layers of the active layer.

* * * * *